(12) United States Patent
Park et al.

(10) Patent No.: US 6,727,514 B2
(45) Date of Patent: Apr. 27, 2004

(54) THIN-FILM SEMICONDUCTOR INTEGRATED CIRCUIT DEVICE AND PICTURE DISPLAY DEVICE WITH USING THEREOF AND MANUFACTURING METHOD THEREOF

(75) Inventors: Seong-kee Park, Hachioji (JP); Kiyokazu Nakagawa, Kofu (JP); Nobuyuki Sugii, Tokyo (JP); Shinya Yamaguchi, Mitaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/811,561

(22) Filed: Mar. 20, 2001

(65) Prior Publication Data

US 2001/0048108 A1 Dec. 6, 2001

(30) Foreign Application Priority Data

May 30, 2000  (JP) ......................... 2000-164707

(51) Int. Cl.[7] .......................... H01L 29/06; H01L 29/04
(52) U.S. Cl. ..................... 257/20; 257/59; 257/63; 257/72; 257/628
(58) Field of Search ........................ 257/20, 63, 59, 257/72, 628

(56) References Cited

U.S. PATENT DOCUMENTS 6,084,247 A * 7/2000 Yamazaki et al. ............ 257/58
6,172,380 B1 * 1/2001 Noguchi et al. .............. 257/64
6,335,541 B1 * 1/2002 Ohtani et al. ................ 257/59
6,388,270 B1 * 5/2002 Yamazaki et al. ............ 257/59
6,392,253 B1 * 5/2002 Saxena ........................ 257/59

OTHER PUBLICATIONS

R. Shimokawa et al., "Characterization of High–Efficiency Cast–Si Solar Cell Wafers by MBIC Measurement", *Japanese Journal of Applied Physics*, vol. 27, No. 5, May, 1988, pp. 751–758.

* cited by examiner

*Primary Examiner*—George Eckert
*Assistant Examiner*—Joseph Nguyen
(74) *Attorney, Agent, or Firm*—Antonelli, Terry, Stout & Kraus, LLP

(57) ABSTRACT

At least one of a semiconductor thin-film for forming a picture display portion and a semiconductor thin-film for forming a peripheral circuit portion, which are accumulated on one common insulative substrate, is constructed with a semiconductor thin-film having a plural number of semiconductor crystalline portions formed to be divided and disposed in a matrix-like, and TFTs are provided in the semiconductor thin-film by bringing those semiconductor single crystal portions into active portions thereof. For that purpose, a crystallization accelerating material is adhered at the position of lattice points of a matrix and is treated with heating process, for forming the single crystal portions disposed in the matrix-like manner, so as to form the TFTs on the surface thereof, thereby completing the thin-film semiconductor integrated circuit device.

8 Claims, 9 Drawing Sheets

THIN-FILM SEMICONDUCTOR INTEGRATED CIRCUIT DEVICE AND PICTURE DISPLAY DEVICE WITH USING THEREOF AND MANUFACTURING METHOD THEREOF

BACKGROUND OF THE INVENTION

1. Field of the Invention

The present invention relates to a thin-film semiconductor integrated circuit, a picture display device with using thereof, such as a liquid crystal display device, etc., and a manufacturing method thereof.

2. Description of Prior Art

In recent years, attention was paid upon a thin-film semiconductor integrated circuit, in which circuits are constructed by forming a plural number of thin-film transistors (hereinafter, abbreviated by "TFT") on a single glass substrate. As an example of an application thereof can be listed up display devices, such as a liquid crystal display device, an EL (electro luminescence) display device, etc.

Conventionally, in particular, in a case of a picture display device, although a picture display portion of, such as pixel portions, etc., can be formed on a glass plate, however other portions for driving the picture display portion must be formed on an ordinary print circuit board, i.e., peripheral circuit portions, such as, a source driver, a gate driver, a shift register, a peripheral controller, etc., and this must be connected to the glass substrate by means of a cable terminal (s), thereby to be used. With such the method, there are pointed out drawbacks that the screen is small in sizes (i.e., from 4 inches to 10 inches), and that the costs also come to be high of the apparatus as a whole.

As a solution of such the drawbacks, it is possible to increase up the screen size greatly by forming the picture display portion and the driver, etc., on a signal substrate in one body, thereby to realize a picture display device, such as, a large screen wall hang television and/or monitor for a personal computer of high performances. However, for processing a large amount of information signals for a high-definition picture display portion, it is very important problem to improve driving capacities of the peripheral circuit portions, such as the driver, etc.

Accordingly, in order to improve the performances (in particular, electron mobility) of TFTs constructing the peripheral circuit portions, such as the driver, etc., extremely, it is necessary to prevent carriers from scattering on grain boundary by an improvement in a crystal property within an active region or area of those TFTs, and thereby to realize a high mobility.

However, for crystallization of Si film on the glass substrate, the crystallization must be performed under temperature being lower than a temperature (about 450° C.) of generating distortion within the glass substrate, however the crystallization will not occur under such the low temperature, such as about 450° C.

In recent years, as a means provided for dissolving such the problem, there are listed up a laser annealing method and a crystallization accelerating method, etc.

The laser annealing method is a one, wherein a amorphous crystalline or a fine crystalline Si thin-film, which is formed on the glass substrate by a decompression CVD method, etc., is melt and re-crystallized by using an eximer laser, and with this it is possible to form polysilicon Si having a particle diameter of around to 100 $\mu$m under the temperature lower than 450° C. However, axes of those crystals are in disorder and the surface scattering is large on the grain boundary which exists within the active region of the TFT, therefore, accompanying with this, the electron mobility comes to be large. For example, an electron effective mobility is about from 30 to 50 cm$^2$/Vs (Japanese Patent Laying-Open No. Hei 9-27452 (1997)), and this is low comparing to that of the single crystal Si, about 500 cm$^2$/Vs (S. M. Sze, Physics of Semiconductor Devices, P. 29, Second Edition, Wiley).

Also, in the Si thin-film on a insulator substrate having a high crystallizing temperature, a catalyst element introduction method is proposed as a means, for reducing down the crystallizing temperature thereof. For an example, a method wherein crystal nucleus is formed on the insulator substrate, on which is formed amorphous crystal silicon in a solid phase (Japanese Patent Laying-Open No. Hei 8-316485 (1996)), a method wherein on a polysilicon are formed accumulated layers of amorphous crystal silicon, on which is formed an exposed polysilicon, as the nucleus for a next crystal growth (Japanese Patent Laying-Open No. Hei 8-31749 (1996)), a method wherein a partially crystallized silicon thin-film is amorphous crystallized selectively by ion implantation while the remaining crystalline portion is grown into crystal, again as the nucleus (Japanese Patent Laying-Open No. Hei 10-55960 (1998)), a method of accelerating a speed of crystallization by means of diffusion of metal elements (Japanese Patent Laying-Open No. Hei 9-27452 (1997), Japanese Patent Laying-Open No. Hei 10-64819 (1998) and Japanese Patent Laying-Open No. Hei 11-186164 (1999)) and a method of varying irradiation energy and irradiation time in a manner of step-like (Japanese Patent Laying-Open No. Hei 10-97993 (1998)), etc.

In particular, in a case where a metal, such as Ni, etc., there is a problem that the metal added remains within the active region of the TFT, thereby decreasing down the performance of the TFTs extremely (in particular, a great increase in an Off current). As a means for dissolving such the problem, a high-temperature processing (600–900° C.) is proposed, being so-called a gettering for removing the remaining metals therefrom. Because of this gettering temperature, the substrate to be used therein must be one of high cost, such as, quartz or crystallized glass, etc., having high temperature resistance, (for example, being disclosed in Japanese Patent Laying-Open No. Hei 11-87243 (1999), Japanese Patent Laying-Open No. Hei 11-186563 (1999), Japanese Patent Laying-Open No. Hei 11-191628 (1999), and Japanese Patent Laying-Open No. Hei 10-135469 (1998)), and as a result, there is an anxiety that it comes off the inherent object, i.e., a low-temperature process with low cost.

Furthermore, as another approach than the mentioned above, an idea is disclosed, wherein taking into the great consideration a high-speed operation characteristic, polysilicon germanium is used as the active layers of the TFTs, which construct the driver circuit and the signal processing circuit, in Japanese Patent Laying-Open No. Hei 11-251600 (1999).

Any one of those various methods for crystallization cannot be said to be a technology being fully complicated, therefore the maximum particle diameter attained is still small and a control is insufficient on positions of the crystal particles. It falls short of a practical size of about 8 $\mu$m of the thin-film transistors, which are required for a liquid crystal panel of a large screen, and it is difficult to suppress unevenness or fluctuation in a distance between elements, due to positional shift of the crystal particles. Furthermore, directions of planes on the formed poly-crystal are in disorder, therefore the electron mobility depending upon the plane direction varies between the elements. Because of this, it does not comes up to a condition those technologies substitute the existing thin-film transistor devices.

SUMMARY OF THE INVENTION

An object, according to the present invention, is to provide an improved thin-film semiconductor integrated circuit device and a picture display device using thereof.

Also, another object, according to the present invention, is to provide a manufacturing method for manufacturing such the thin-film semiconductor integrated circuit device, easily and with good repetitiveness.

Explaining briefly on representative ones of various inventions disclosed in the present application, they are as follows:

Namely, according to one of the present invention, there is provided a thin-film semiconductor integrated circuit, comprising: a insulator substrate, such as of glass; a plural number of semiconductor single crystal portions accumulated on the insulator substrate, being divided and disposed in a matrix manner; and thin-film semiconductor circuit elements, each having activated region on a surface of that semiconductor single crystal portion. Further, those semiconductor single crystal portions disposed in the matrix-like manner in the vertical and horizontal directions are separated from each other through a crystal grain boundary therebetween, or separated through an amorphous crystalline or crystalline material or insulator.

Also, with the thin-film semiconductor integrated circuit device according to other present invention, those plural number of semiconductor single crystal portions are aligned regularly and periodically in the vertical and horizontal directions, wherein each surface of those shows (110) plane and each of the semiconductor single crystal portions is bonded in one body through the crystal grain boundary.

With such the structure, it is possible to realize the thin-film semiconductor integrated circuit device having superior electric characteristics, wherein a large number of TFTs, being equal in the characteristics (namely, each having uniform electric characteristics), are disposed on the insulator substrate of, such as glass, in the matrix-like manner, so as to be integrated in one body.

Further, by applying such the thin-film semiconductor integrated circuit device into a picture display portion and/or a peripheral circuit portion of a picture display device, it is possible to realize a picture display device of high performances. Namely, TFTs constructing the picture display portion and/or the peripheral circuit portion are formed upon surfaces of the single crystals where no crystal grain boundary exists, which are divided and disposed periodically, thereby maintaining high mobility for those TFTs, so as to enable the picture display portion and/or the peripheral circuit portion to operate at high speed, and further since the surfaces of those plural number of single crystals are disposed regularly in the matrix-like manner in the vertical and horizontal directions, then a fine and complicated thin-film circuitry can be formed on the insulator substrate of glass, etc., collectively, in the same manner as the ordinary LSIs, and also inner-wiring and cross-wiring can be formed easily, in the same manner.

For example, by applying the above-mentioned thin-film semiconductor integrated circuit device into the picture display portion, on which a large number of TFTs for use as pixels are disposed in the matrix-like manner at a high density, it is possible to obtain a remarkable effect therefrom.

On a while, it is also possible to apply the thin-film semiconductor integrated circuit device according to the present invention into TFTs constructing the peripheral circuit portion while forming TFTs constructing the picture display portion in amorphous crystalline semiconductor regions. In this instance, it is possible to improve the high speed operation of the peripheral circuit portion, and at the same time to ensure the displaying performance same to the conventional one, with which the Off current in the picture display portion can be reduced, thereby suppressing the fluctuation in nobilities between the TFTs for use of pixels.

Furthermore, it is needless to say that the thin-film semiconductor integrated circuit according to the present invention can be applied into both the picture display portion and the peripheral circuit portions.

Accordingly, in the picture display device, according to one of the present invention, in a first and a second semiconductor thin-film regions accumulated on a common insulator substrate are provided a first thin-film semiconductor circuit element for constructing a picture display portion and a second thin-film semiconductor circuit element for constructing a peripheral circuit portion for driving that picture display portion, wherein at least one of the first and the second thin-film semiconductor circuit elements, in particular, the active regions thereof are provided on the plural number of semiconductor single crystal portions, which are divided and disposed in a matrix-like manner in the first or the second semiconductor thin-film region corresponding thereto.

According to such the present invention, the picture display portion and the peripheral circuit portion, such as a driver, etc., can be formed in one body on one piece of common glass substrate, thereby providing a picture display device in cheap, but having high performances and a large screen area therewith.

Also, according to the present invention, in such the thin-film semiconductor integrated circuit, a crystallization accelerating material is adhered at each of lattice points in a matrix, upon a surface of the amorphous crystalline thin-film semiconductor layer, which is accumulated on an upper portion of an insulator for forming semiconductor circuit elements therein, and this thin-film semiconductor layer is treated with heating process, to be crystallized, thereby enabling a large-scaled production thereof, with relative ease.

Further, according to other method of the present invention, after partially adhering the crystallization accelerating material on one side of end portions of each of the plural number of amorphous crystalline semiconductor layers, each of which is accumulated on an insulator for forming the semiconductor circuit elements therein and has a long and narrow portion between the both end portions, they are treated by heating process, so as to form a semiconductor single crystal portion in the amorphous crystalline semiconductor layer, thereby forming the thin-film semiconductor integrated circuit device.

The concrete picture display device, according to the present invention, into which is applied the thin-film semiconductor integrated circuit device formed in accordance with this method, comprises a first and a second semiconductor thin-film regions formed on a surface of a insulator substrate, and a first thin-film semiconductor circuit element formed in the first semiconductor thin-film region, for constructing a picture display portion, and a second thin-film semiconductor circuit element formed in the second semiconductor thin-film region, for constructing a peripheral circuit portion for driving the picture display portion, wherein at least one of the first semiconductor thin-film region and the second semiconductor thin-film region is constructed with a plural number of third semiconductor thin-film regions, each of which is long and narrow in a form and separated from each other, and further each the third semiconductor thin-film region has a semiconductor single crystal portion, extending long and narrow on a surface thereof, in which the first or the second thin-film semiconductor circuit element is provided by bringing those semiconductor single crystal portions into active regions thereof.

As can be understood from the above explanation, the display device, according to the present invention, in particular, in the peripheral circuit portion of a driver or the like, in charge of process of a large amount of information and/or the picture display portion occupying a large area, uses the single crystallized regions as the active regions of the TFTs for constructing them, thereby achieving a display device having a high signal processing speed and/or a high display characteristic.

For example, crystal grains of the single crystal, each having a surface area equal or larger than an area occupied by the active region of TFT, are disposed in a manner of a matrix or periodically, so that the active area of each of TFTs is made of the single crystal, thereby it is possible to form the TFT, in which substantially the crystal grain boundary does not exists within the active area of the TFT, and further this is applied to the peripheral circuit portion, such as the driver, etc., necessitating a high speed operation, and/or the picture display portion, thereby realizing a display device of high performances.

Also, since forming the picture display portion and the peripheral circuit portion, such as the driver, etc., together with in one body, on a single insulator substrate, makes possible of forming a picture display device of high performances and a large size, therefore it is possible to realize a high performance picture display device, by introducing a means for using the forming processes of TFT appropriately, in conformity with the characteristics required by each portion.

DETAILED DESCRIPTION OF PREFERRED EMBODIMENTS

Hereinafter, embodiments according to the present invention will be fully explained by referring to the attached drawings. For easy understanding, explanation will be given, first of all, on a manufacturing method of a thin-film semiconductor integrated circuit device according to the present invention.

Explanation will be given effects of catalytic agents or elements, which are introduced for accelerating the crystallization in the present invention, (hereinafter, being called by "crystallization accelerating material"). Also, for simplification, an effect will be explained in a case where Ge or Ni is introduced into Si, as the crystallization accelerating material thereof, for a representative example, below, however the same can be established, between a thin-film made of any one of the elements of the IV group, i.e., C, Si, Ge, Sn and Pb or of a mixed crystal thereof and the elements (any one of C, Si, Ge, Sn, Pb, Ni, Co, Cu, Pd, Pt, Ag, Au, In, Al and Sb) other than that and a mixed crystal thereof.

EXAMPLE 1

FIGS. 1(*a*) to (*d*) are views for showing a thin-film semiconductor integrated circuit device and a manufacturing method thereof, in connection with a first embodiment of the present invention, and in particular FIGS. 1(*a*) and (*c*) are plan views thereof while the FIGS. 1(*b*) and (*d*) cross-section views thereof.

First, as shown in the FIGS. 1(*a*) and (*b*), on an insulator substrate 101, such as a glass plate, a semiconductor thin-film 102 of amorphous crystal (using Si in the present embodiment) is formed at thickness of about 80 nm, by accumulating it at room temperature through an ordinary CVD method. On this, the crystallization accelerating material 103 is adhered or pasted, to form a size of 0.5 $\mu$m in a diameter and at positions of cross-points of a matrix, i.e., at a distance of width 10 $\mu$m, regularly and periodically, through a series of pattern forming processes, such as, resist pasting, photo-mask exposing, developing, etching, and evaporation.

Figure 2A:
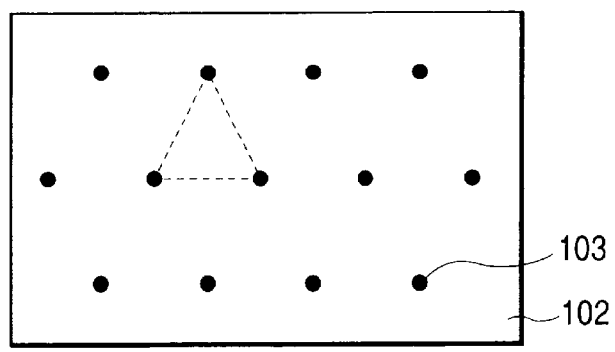
FIGS. 2(*a*) to (*c*) are plan views for explaining the thin-film semiconductor integrated circuit device and the manufacturing method thereof, in connection with the first embodiment of the present invention.
Figure 2B:
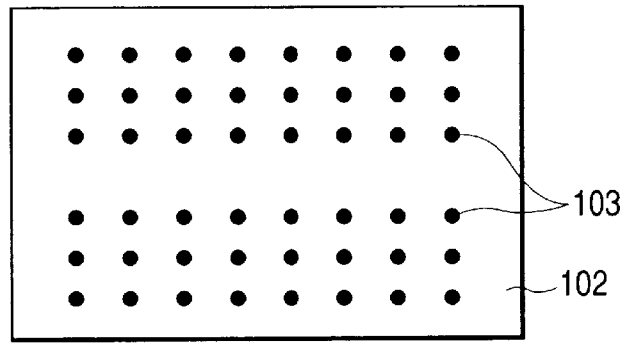

According to the present embodiment, the crystallization accelerating material 103 is disposed in a form of a square, however depending upon cases, it may be disposed in a form of a triangle or the others than that, as shown in the FIG. 2(*a*). Also, as shown in the FIG. 2(*b*), it may be adhered and formed in a specific region or area selected on an amorphous crystalline film 102.

Figure 3A:
FIGS. 3(*a*) and (*b*) are cross-section views for explaining the thin-film semiconductor integrated circuit device and the manufacturing method thereof, in connection with the first embodiment of the present invention.
Figure 3B:
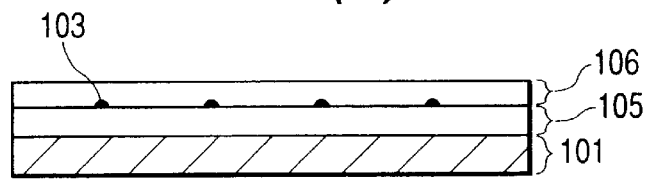

Also, the crystallization accelerating material 103 should not restricted only to the adhesion upon an upper side surface of amorphous crystalline semiconductor thin-film, but also may be adhered and disposed between the insulator substrate 101 and an amorphous crystalline film 104 as shown in the FIG. 3(a), or at a position between two layers of the amorphous crystalline films 105 and 106. In any case, it is necessary that the crystallization accelerating material contacts with or adheres to each of the cross-points of the matrix.

Further, in a case where the crystallization accelerating material 103 is put between the two layers of the amorphous crystalline films 105 and 106 herein, a thickness L1 of a first amorphous crystalline film 105 is preferable to be equal or greater than 10 nm and equal to or less than 1 μm, and a thickness L2 of a second amorphous crystalline film 106 equal to or less than 1 μm, in a range.

As was mentioned in the above, after adhering and forming of the crystallization accelerating material 103, next crystallization of the amorphous crystalline film 102 is conducted by heating process thereof. With conditions of the heating process, an appropriate temperature (for example, from 400 to 600° C.) and an annealing time (for example, from 1 to 50 hours) can be selected depending upon a kind the above-mentioned crystallization accelerating material or the diameter (namely, the size) or the distance of the crystallization accelerating material 103. etc. In the present embodiment, the annealing is conducted for ten (10) hours under a nitrogen atmosphere (under atmospheric pressure) and temperature 450° C.

Figure 1A:
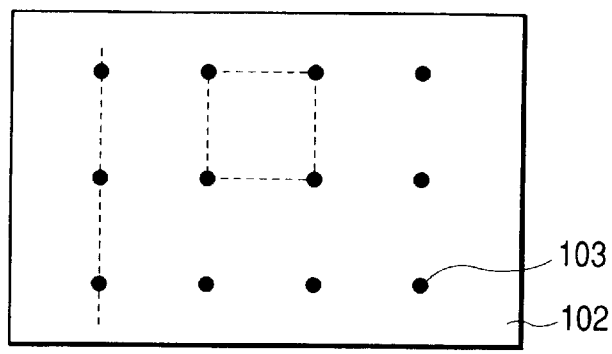
FIGS. 1(*a*) to (*d*) are views for showing a thin-film semiconductor integrated circuit device and a manufacturing method thereof, in connection with a first embodiment of the present invention, and in particular FIGS. 1(*a*) and (*c*) are plan views thereof while the FIGS. 1(*b*) and (*d*) cross-section views thereof.
Figure 1B:
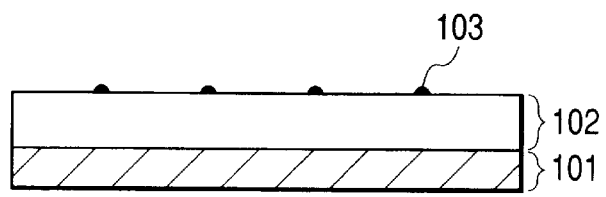
Figure 1C:
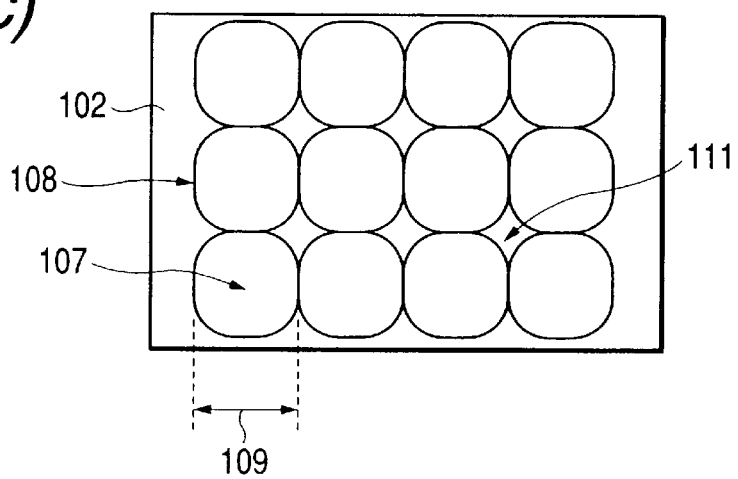
Figure 1D:
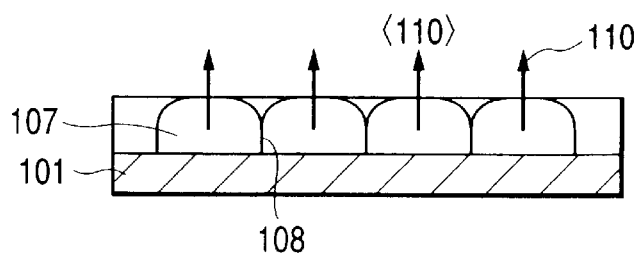

FIGS. 1(c) and (d) are views for explaining the positions of a plural number of crystal grains (semiconductor single crystal portion) after the heating process of the amorphous crystalline semiconductor thin-film, onto which the crystallization accelerating material is adhered (or can be said "added to"), as shown in the FIGS. 1(a) and (b). The crystallization is spread out from the each crystallization accelerating material 103, directing in equal directions thereof to a peripheral thereof (all of the crystal grains should not be directed in the equal directions, necessarily), therefore each of the crystal grains 107 are disposed at an almost equal distance therebetween and are formed. In the drawing, a reference numeral 109 indicates a size or largeness of the crystal grains 107, and 108 a crystal grain boundary which is formed on a boundary surface between the crystal grains themselves.

Also, it is ascertained that an angle defined between a crystal axis, <110> direction 110, which a surface of each of the crystal grains 107 has, and the vertical direction of the above-mentioned insulator substrate 101 lies from 0 to 5 degree, and that each of the crystal grains 107 is a single crystal having a main surface nearly aligned to a (110) plane. Namely, each of the single crystal or single crystal portion 107 is divided into sections respectively, in a matrix manner on the insulator substrate 101, by the crystal grain boundary 108, and is disposed on the insulator body 101, being connected therewith as a unit or in one body.

And, it is also ascertained that remaining semiconductor layers 111 of others than the crystal grains are of the amorphous crystal as they are, or are poly-crystallized, depending upon a condition of the heating process, however in any case, they form an almost one main surface level in common with the above-mentioned crystal grains 107. This is advantageous for forming TFTs and wirings on this main surface afterward.

Also, in each of the crystal grains, a distribution of the concentration on the added crystallization accelerating material is reduced down abruptly when it comes off from a center of the adhere portion (a region) 103 of the crystallization accelerating material before the heating process thereof. Namely, it is ascertained that almost of the crystallization accelerating material is contained in the center of each of the crystal grains 107 in a form of a Si compound.

Figure 4A:
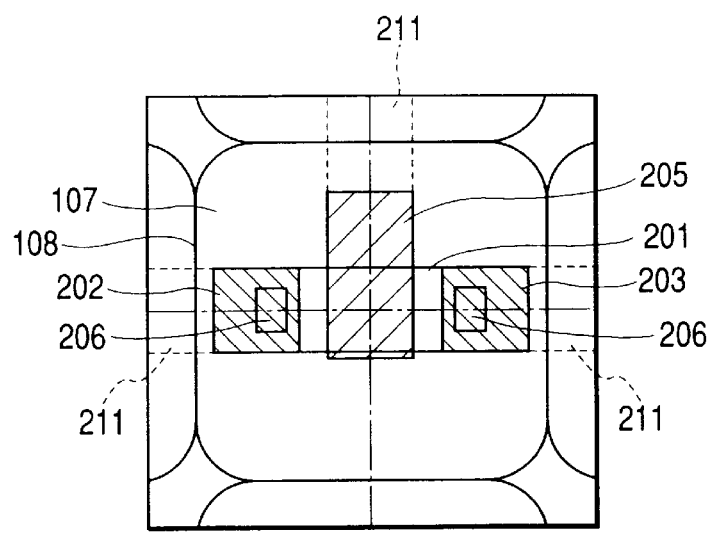
FIGS. 4(*a*) and (*b*) are a plan view and a cross-section view of the thin-film semiconductor integrated circuit device and the manufacturing method thereof, respectively, in connection with the first embodiment of the present invention.
Figure 4B:
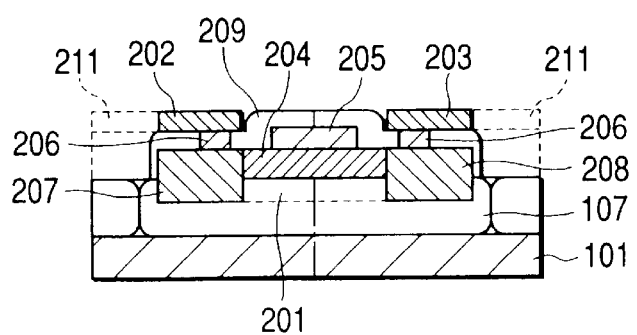

FIGS. 4(a) and (b) are views for showing a TFT formed on the semiconductor single crystal portion 107, which are obtained through the manufacturing method mentioned above and are shown in the FIGS. 1(c) to (d), and in particular, the FIG. 4(a) shows a plan view of an essential or principle portion thereof while the FIG. 4(b) the cross-section views thereof.

Namely, with each TFT, an active region 201, such as the channel region thereof, etc., is formed on a main surface portion of each the crystal grain 107 of the single crystal, which is obtained according to the embodiment 1 mentioned above. A reference numeral 201 indicates that active region, 202 a source electrode, 203 a drain electrode, 204 a gate insulator film, 205 a gate electrode, 206 a source contact and a drain contact, 207 a source region, 208 a drain region and 209 a insulator film between layers (an inter-layer insulator film).

Further, in the FIGS. 4(a) and (b), for easy understanding, only one TFT is emphatically depicted that it be formed in the single crystal portion, however for constructing an integrated circuit device, the source electrode, the drain electrode, and the gate electrode, etc., must be provided with wirings, which are provided on an upper surface of such the semiconductor thin-film through an insulator film, so as to be electrically connected to other TFT(s) or the like, as shown by a dot-line 211 in the figure. Namely, such the wirings construct a predetermined circuitry while crossing over the crystal grain boundary 108 between the plural single crystal portions formed in plural number.

Figure 5A:
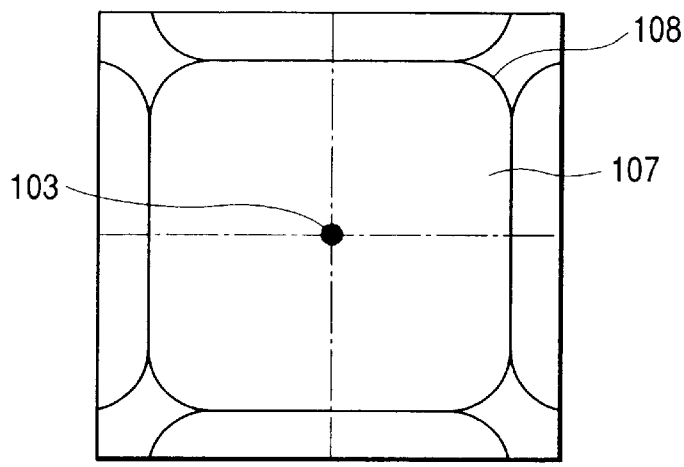
FIGS. 5(*a*) and (*b*) are views for explaining the first embodiment of the present invention, and they are a plan view and a graph of measurement on a characteristic thereof.
Figure 6A:
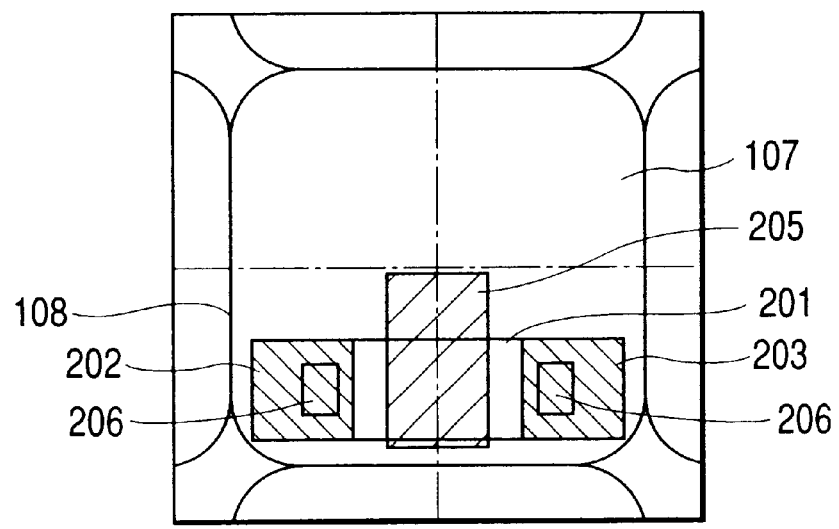
FIGS. 6(*a*) and (*b*) are plan views of a TFT, for explaining the first embodiment of the present invention.

Next, explanation will be given on capable configurations of the active regions when the active region 201 of the TFT are formed on one crystal grain 107, by referring to FIGS. 5(a) and (b) and FIGS. 6(a) and (b).

Figure 5B:
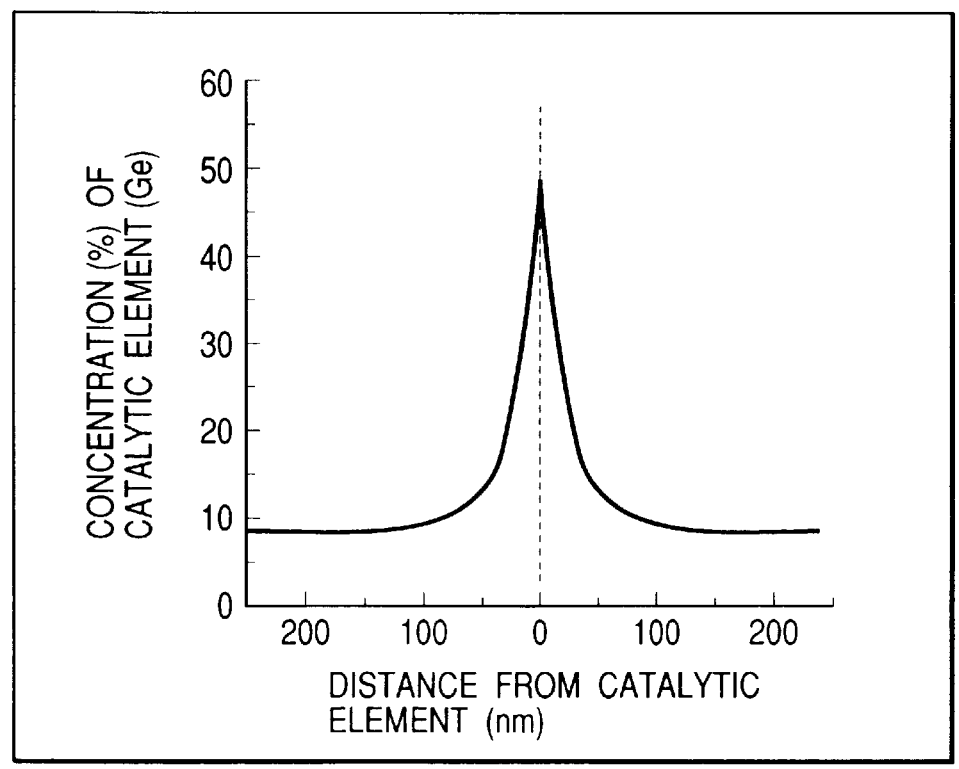

In the embodiment 1 mentioned above, when Si is employed for forming the amorphous crystalline film 102 while a semiconductor element is employed as the crystallization accelerating material 103, for example, Ge, being different from that of forming the semiconductor thin-film, the above-mentioned crystal grain 107 contains therein Si compositions, which can be expressed by $Si_{1-x}Ge_x$ (0×1). As a result of an investigation on Ge concentration distribution within the crystal grain, being made by the present inventors through "Energy Dispersive X-ray analysis (EDX)" and "Rutherford back scattering (RBS)" method, as shown in the FIG. 5(b), the Ge concentration comes to be equal to or lower than 50 wt % in an inside of the central region (103) where the crystallization accelerating material is disposed, to be the region where the Ge concentration is at the highest, and it comes down to be equal to or less than 10% at the position separated therefrom by a distance 100 nm. Also, the FIG. 5(a) is a top plan view for showing a relationship between the disposition of the crystal grain after the heat processing and that of the crystallization accelerating material at beginning.

Since Ge is larger than Si in an averaged curvature radius at a bond end, Ge is added into Si as the mixed crystal, thereby decreasing an effective mass of carriers. Accordingly, the mixture of Ge into Si is effective of increasing the mobility of carriers, as well as of improving characteristics or property of the elements of TFT. However, at the same time, if the Ge concentration is too high, it brings about a disadvantage of accelerating the deterioration in the gate insulator film of, such as $SiO_2$, etc.

It is ascertained by the present inventors that the effect of improving the element characteristics of is larger than that of the disadvantage mentioned above, if the Ge concentration is equal to or lower that 50% to Si. Accordingly, a TFT active region can be formed on a surface position, including the center of the crystal grain 107 (namely, at a position just below a portion adhered with Ge), as shown in FIGS. 4(a) and (b), and also having a good efficiency in space factor.

Also, on a while when as the crystallization accelerating material is employed a metal other than Ge in the embodiment 1 mentioned above (in more details, any one of Ni, Co, Cu, Pd, Pt, Ag, Au, In, Sn, Al and Sb, or a mixed crystal thereof, and it is called by "crystallization accelerating metal" for distinction from Ge), since those metals bring about decrease in the propaty of transistors obtained therefrom, it is preferable to form the active area 201 of TFT at the position separated from the crystallization accelerating metal 103. In more details, it is ascertained that, preferably the active region of TFT be provided in the single crystal region containing the crystallization accelerating metal 103 of less than $10^{19}$ atoms/cm$^3$ therein.

As a result of an investigation made by the present inventors with using EDX and TEM (Transmission Electron Microscope), it is ascertained that, in a case where Ni is employed as the crystallization accelerating metal, a large amount of Ni lies in a form of $Ni_2Si$ within the adhered portion 103 of the crystallization accelerating metal, but it is decreased down in the concentration thereof, abruptly if it comes off therefrom by a distance of about 100 nm. Also, almost nothing can be ascertained at the position where it is separated therefrom by a distance equal to or longer than 150 nm, and a very little amount of the concentration (0.01% or lower than that) can be ascertained in the vicinity of the crystal grain boundary 108.

Since those metals within Si rise up Off current, being an important value in the characteristics of TFT, it is not preferable for them to be contain them within the active region of TFT. Then, for the purpose of preventing them from being diffused into the active region, due to re-diffusion of metals after the forming of TFT, it is preferable to remove the region containing the crystallization accelerating metal(s) therein by etching.

Figure 6B:
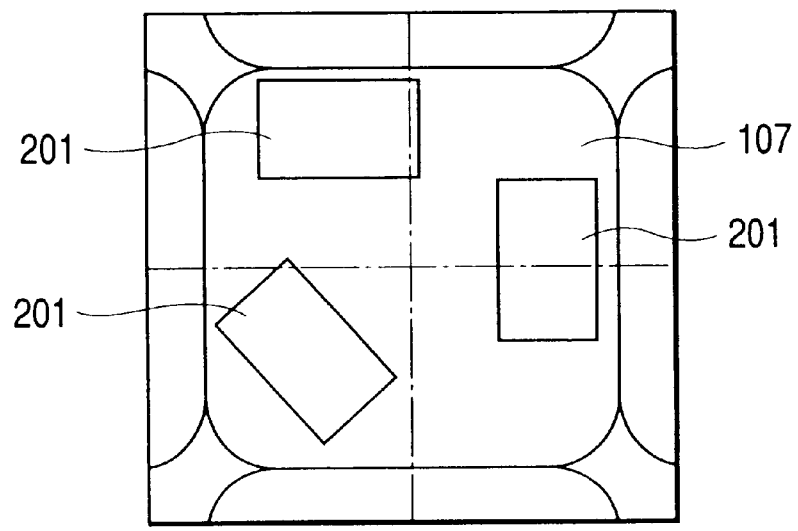

As is shown by the possible disposition of the TFT active region 201 in the FIGS. 6(a) and (b), when employing the crystallization accelerating material of a metal other than Ge, it is desirable to form the active area at a position, not containing the region just below the central portion (103) where it is disposed and the region (108) of the crystal grain boundary therein and further being as far as possible from the central region (103) where the crystallization accelerating material is disposed, namely, at a position being eccentric therefrom, for example, at a position being separated therefrom by a distance equal to or longer than 150 nm. Namely, it does not matter that the TFT be disposed at any position, so far as not contain the central region (103) and the crystal grain boundary region (108) therein. Also, as shown in the FIG. 6(b), it is also possible to form a plural number (three (3) in the drawing) of TFTs in one of the crystal grains 107.

Next, explanation will be given on the steps for forming the TFTs in the single crystal grain (semiconductor crystal portion) of the embodiment 1 mentioned above, by referring to FIGS. 7(a) to (f).

Figure 7A:
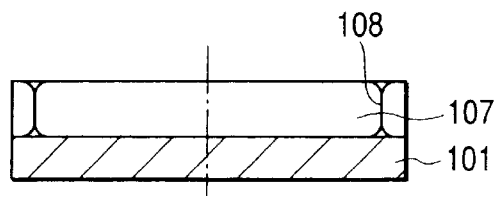
FIGS. 7(*a*) to (*f*) are views for explaining the first embodiment of the present invention, and they are cross-section views of a TFT manufacturing method.
Figure 7B:
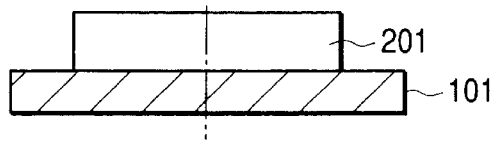

As shown in the FIG. 7(a), a plural number of TFTs may be formed on a continuous polycrystalline thin-film, on which a plural number of single crystal grains 107 of N-type or P-type are divided and disposed in a matrix manner, however, explanation will be given herein on an example, where at least one TFT is formed on the single crystal grain 201, which is formed by removing the crystal grain boundary region 108 through the etching technology and is isolated (namely, being disposed, separating from the others by an insulator, such as an air, etc.), as shown in the FIG. 7(b). However, the upper surface of this single crystal grain 201 is also etched lightly and cleaned.

Figure 7C:
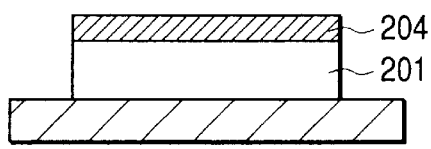

As shown in the FIG. 7(c), the gate insulator film 204 of an insulator, such as $SiO_2$, etc., is formed on the surface of the single crystal grain, in thickness from 20 to 50 nm through plasma CVD method or decompression plasma CVD method.

Figure 7D:
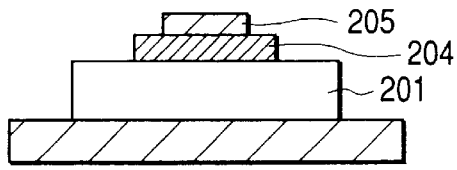

Next, as shown in the FIG. 7(d), the gate electrode 205 of Al film is formed partially on the gate insulator film 204, and it is removed with remaining a portion of the gate insulator film through dry etching. Further, the remained end portions of the gate insulator film 203 and of the upper gate electrode 205 are formed to file up by self-alignment, but they are depicted herein while being enlarged for better understanding thereof.

Figure 7E:
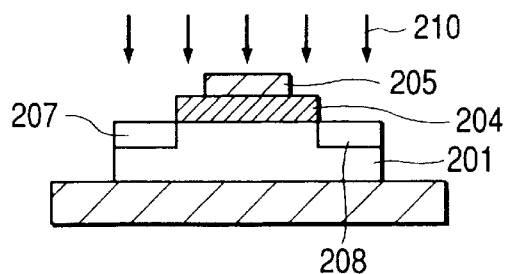

After that, as shown in the FIG. 7(e), an ion of N-type impurity (phosphorus or arsenic) or P-type impurity (boron) is injected (arrow 210), thereby forming the source region 207 and the drain region 208. Thereafter, by using any one of means, i.e., farness annealing, lamp annealing and laser annealing, activation of the ion of impurity that is injected.

Figure 7F:
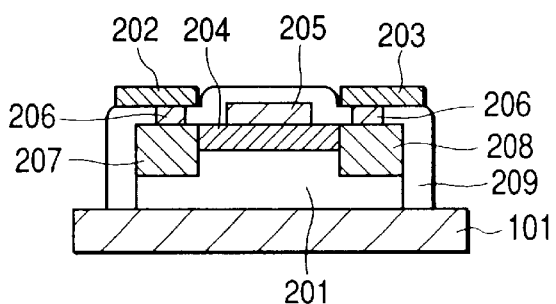

Next, as shown in the FIG. 7(f), the inter-layer insulator film 209, the source-drain contact 206, the source electrode 202 and the drain electrode 203 are formed. Further, for forming the inter-layer insulator film 209, it is possible to employ a material that is selected from silicon oxide, silicon nitride, nitrogen silicon oxide, and resins.

Also, by referring to the FIG. 1(a) and the FIGS. 2(a) and (b), the explanation was made on the necessity of disposing the crystallization accelerating material 103 on the amorphous crystalline semiconductor thin-film 102 in a matrix manner, however, as be shown by a plan pattern view of the disposition of adhesion of the crystallization accelerating materials for advancing the crystal growth from those crystallization accelerating materials effectively, the crystallization accelerating materials 113 located at the most peripheral portion is provided in the same pattern at an outer peripheral portion of the amorphous crystalline semiconductor region 102 for use as a dummy, therefore a plural number single crystals can be formed within the region inside thereof, with an equal quality, and with good repetitiveness and efficiency.

As was in the above, the plural number of semiconductor single crystal portions (regions) are regularly (periodically) disposed in the vertical and horizontal directions, in a manner of a matrix, in the present embodiment, therefore it is possible to achieve mass-production of the integrated circuit devices having uniform electric characteristics, collectively, in a manner almost same to that on the manufacturing process of the ordinary LSIs.

EXAMPLE 2

In the example 2, explanation will be given on a crystallization process of amorphous crystalline thin-film of group IV by using a means, which is different from that used in the embodiment 1, and a forming process of the thin-film semiconductor integrated circuit device on that thin-film, by referring to FIGS. 8(a) to (f).

Figure 8A:
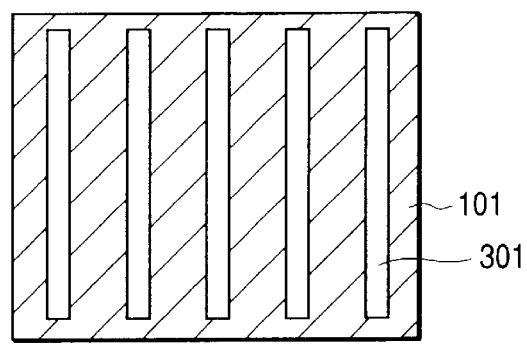
FIGS. 8(*a*) to (*f*) are views for showing a thin-film semiconductor integrated circuit device and a manufacturing method thereof, in connection with a second embodiment of the present invention, and in particular FIGS. 8(*a*) and (*f*) are plan views thereof while the FIGS. 8(*b*) to (*e*) cross-section views thereof.
Figure 8B:
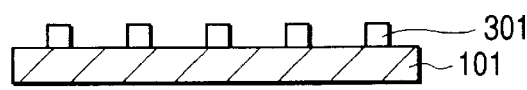

As shown in the FIG. 8(a), on the amorphous crystalline thin-film of group IV which is formed on the insulative substrate 101, patterns 301 of amorphous crystalline semiconductor thin-film (Si) are formed, each having length from 100 nm to 20 μm, width from 100 nm to 20 μm, thickness (film thickness) from 10 nm to 1 μm and long and narrow portions at both ends thereof (for example, in a form of a rectangular or a strip-like). Each of those plural long and narrow rectangular amorphous crystalline Si films 302, as will be mentioned latter, come to be a TFT active regions 201 or a portion thereof after crystallization process thereof. Further, the FIG. 8(a) shows a top plan view, and the FIG. 8(b) across-section view thereof in the horizontal direction. Also, in actual, a large number of film patterns 301 are regularly formed in a manner of a matrix, in the vertical and horizontal directions, in the same manner as in the embodiment mentioned above, however in those figures, only 5 pieces of the film patterns are depicted for the purpose of simplification thereof.

In the present embodiment, explanation will be given on a case where, on the amorphous crystalline Si thin-film on the insulative substrate 101, the amorphous crystalline Si on peripheries are removed by etching, so that the rectangular amorphous crystalline Si thin-films 301, each having length of 20 μm, width of 1 μm and thickness (film thickness) of 80 nm, are remained at a distance of 5 μm between them, however the distance between them can be widen much more so that wiring can be formed between those rectangular Si thin-films.

Figure 8C:
Figure 8D:

Next, as shown by the cross-section view of the vertical direction in the FIG. 8(c), at one tip portion of the each rectangular amorphous crystalline Si thin-film 301 is adhered the crystallization accelerating material 302. In the present embodiment, Ni is adhered at width 1 μm and at thickness 3 nm, however an amount of this crystallization accelerating material should not be restricted to this, but it may be increased or decreased. Also, as shown in the FIG. 8(a), as far as the rectangular amorphous crystalline Si thin-films 301 are divided and disposed in a manner of a matrix, also those crystallization accelerating materials 302 are disposed regularly in the matrix manner.

Next, the crystallization is conducted by a heating process. In the present embodiment, annealing is done for ten (10) hours at the temperature of 450° C., however since the crystallization has profiles in temperature and time of a thermo-active type, it is possible to obtain the same crystal if the annealing time and temperature are selected correspondingly to a crystal growth distance being necessitated. Through this crystallization process, one piece or several pieces of crystal grain 303 of single crystal Si, each having a rectangular surface extending long and narrow, are formed inside the rectangular amorphous crystalline Si film 301, and as a result, as shown in the FIG. 8(d), rectangular polycrystalline Si thin-films 304 are formed. In the present embodiment, it is confirmed that the single crystal region 303, having diameter of about 80 nm and length of about 20 μm, is formed inside the above-mentioned rectangular polycrystalline Si thin-film 304, by means of a SEM (Scanning Electron Microscope) and/or TEM.

Further, it is ascertained that this rectangular crystal grain 303 has a crystal direction almost equal to the crystal axis <110> which is vertical to the substrate 101, and also that a growth direction of the rectangular crystal grain 303 has a crystal axis <111> direction. Also, as a result of investigation by EDX, in the above-mentioned rectangular crystal grain 303, it is ascertained that Ni exists in a condition of the compound of $Ni_xSi_y$ (x and y indicate composition ratio between Ni and Si), from the portion just below a Ni added region where the above-mentioned crystallization accelerating material is added up to the position separated from that region at a distance of about 50 nm, and that Ni exists in a condition of $NiSi_2$ in a fine region at a tip of growth of the rectangular crystal grain 303.

Figure 8E:
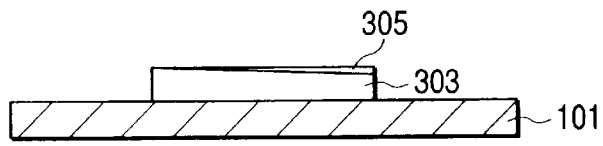
Figure 8F:
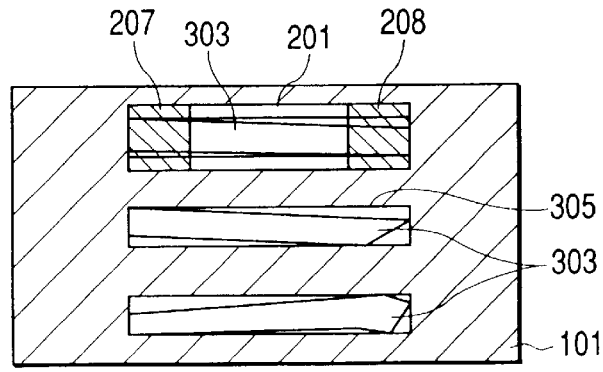

Next, for the purpose of containing no Ni in the active region of TFT to be formed, or of protecting the TFT active region from a phenomenon of invasion of Ni due to re-diffusion thereof, both ends of the rectangular polycrystalline Si thin-film 304 are removed by etching, so as to form the rectangular single crystal Si thin-film 303 to be the active region of the TFT, as shown in the FIG. 8(e), and thereafter the TFTs are formed on the rectangular single crystal Si thin-film 303, as shown in the above-mentioned embodiment. The FIG. 8(f) shows a top plan view thereof, wherein a reference numeral 207 indicates a source region, 208 a drain region, 201 an active region, respectively. Although only one TFT is indicated in the same figure, however it is needless to say that the TFT is formed on each single crystal region 303 disposed in the matrix-like, in the same manner as mentioned in the above.

Necessarily, in the TFT formed in this manner, the crystal grain 303 of single crystal Si, containing the crystallization accelerating metal of less than $10^{19}$ atoms/cm$^3$ therein, exists below a channel constructing the active region thereof, made of one or plural number of pieces thereof, therefore it is possible to obtain a carrier mobility, being equal to a value of that obtained in the single crystal Si (about 500 cm$^3$/Vs) or near to it. Namely, also in this embodiment, in the same manner as in the embodiment mentioned above, the plural single crystal regions are divided and disposed in the matrix-like manner, into the vertical and horizontal directions, and a plural number of TFTs uniform in electric characteristics are formed with using that single crystal region as the active region thereof.

Next, explanation will be given on an effect in a case of using the rectangular amorphous crystalline Si thin-film 301 which is explained in the FIG. 8(a) mentioned above.

Ni adhered on the amorphous crystalline Si is diffused within Si by giving thermal energy to it, thereby moving while forming a compound of $Ni_xSi_y$. For the compound of Ni and Si, $Ni_xSi_y$, there are several stable phases, being different depending upon the Ni concentration and the temperature. In a region where the Ni concentration is high, such as in the vicinity of the Ni added region, $Ni_2Si$ is in a phase being most stable. At a position separated a little bit therefrom, namely at the position where the Ni concentration is lower than that, NiSi is stable, and this is formed in a region separated at a distance of about 50 nm from the above-mentioned Ni added region.

The above-mentioned $Ni_2Si$ and NiSi continue to exist with stability, as far as a peripheral Ni concentration is in constant. A phase being different from this exists in a region where the Ni concentration is low, and that relates to a crystal growing process closely. That is $Ni_2Si$, and normally it is an instable phase, therefore it always try to shift Ni. In more details, reducing the Ni concentration more makes up the single crystal Si, and driving out excessive Ni to an outside amorphous crystalline Si brings it in stable. This process occurs in sequence, repetitively, thereby the crystal growth occurs into a direction separated from the Ni added region.

A feature of this crystal growth lies in that the formed crystal Si comes to be a tree-like crystal having a longitudinal axis in the growing direction due to distortion caused by a lattice constant difference (0.44%) between Si and NiSi$_2$. Such the single crystal grain made of the rectangular single crystal Si, having NiSi$_2$ at the tip thereof, continues to make the crystal growth with an activation process, which is determined by the temperature and the time, so far as it does not take in a lattice defect therein.

According to a result of experiment made by the present inventors, it is apparent that the rectangular Si single crystal having diameter of 80–100 nm grows up to 1–20 µm. However, if only the amorphous crystalline Si thin-film accumulated on the insulator substrate to be adhered with Ni, but without such the pattern as shown in the FIG. 8(a) mentioned above, the growth of Si crystal is free in the direction with respect to the horizontal surface of the substrate, and it collides with other Si crystal if it lies at a tip of the proceeding direction thereof, thereby being stopped there. Due to this phenomenon, in the region from several tens nm to several hundreds nm from the Ni added region, it comes to be in a polycrystalline condition where irregular Si crystals having length from 100 nm to 1 µm are gathered. Also, it is ascertained that a large amount of Ni and the amorphous crystalline Si regions are included between those Si crystals. Further, at a position being sufficiently separated from the Ni added region, for example, at the position separated by 1 µm or more, the rectangular Si single crystal is small in number of pieces thereof and is relatively short in length.

Because of grasping such the phenomenon, the feature of the present embodiment 2 lies in that long and narrow patterns, such as the rectangular amorphous crystalline Si thin-film 301, are formed in advance, so as to prevent the rectangular Si single crystals thereof from the phenomenon of colliding with each other, thereby forming the rectangular Si single crystal longer, and that those crystal growths are made controllable in directions thereof.

Accordingly, it can be understood that the manufacturing method of TFT according to the present invention should not be restricted to that the plural number of rectangular amorphous crystalline Si thin-films 301 are disposed in the matrix-like manner as was mentioned in the above, but basically, they may be formed partially at a certain specific position where the TFTs are to be formed.

On a while, the growth process of the rectangular Si single crystal has another feature. That is a forming of bicrystal or twin crystal structure, which is peculiar to the structure of diamond. This bicrystal structure has a feature that it is formed in the directions, i.e., (111), (221), etc., of the diamond structure, and that the grain boundary between those twin crystals is electrically inactive. Namely, though being the crystal grain boundary, it does not function as a trap of obstructing the carrier transfer (namely, because of a coherent bonding), therefore substantially, it can be considered that there exists no grain boundary (R. Simokawa and Y. Hayashi: Jpn. J. Appl. Phys. 27, 751(1988)). In particular, in a case where an angle defined by joining the neighboring crystal grains of the (111) twin crystal is 70.5 degree (however, there exist 109.5 degree, 38.9 degree, etc., other than that), a coherence is highest with respect to the grain boundary.

According to a result of the experiment made by the present inventors, it is ascertained that the almost rectangular Si single crystal forms a new rectangular Si single crystal when it grows up to a certain distance or more, and it branches off, to grow up with maintaining the joining angle of about 70.5 degree between them (there are other angles, however that of 97% or more is 70.5 degree), and that it also forms a new twin crystal to branch off when it grows up further. Of course, the growth direction of the rectangular Si single crystal is in <111>, and the direction vertical to the substrate is in <110>. Also, it has a feature that, in a near region, within a distance of about 1 µm from the Ni added region, an averaged length up to a new branch-off is short, and that the farther, the longer in the length thereof. Namely, the farther from the Ni added region or the less in number of the rectangular Si single crystals, the lower the possibility of forming the twin crystal mentioned above.

From this, it is desired that the active region of TFT is formed to be separated sufficiently from the Ni added region. Though this depends upon external parameters, such as an amount of Ni added, a pattern size crystallization temperature, time, etc., however it can be ascertained that it has repeatability.

Also, it is desired to set the width equal to or less than 20 µm for the amorphous crystalline semiconductor thin-film, being provided on the insulator substrate, such as of glass, and having the long and narrow portion between the both end portions, and it is ascertained that a desirable rectangular Si single crystal portion can be formed with a good repeatability, in particular, if it is a tin-film having sizes of length from 100 nm to 20 µm, width from 100 nm to 20 µm, and thickness (film thickness) from 10 nm to 1 µm.

(Embodiment 3)

In the present embodiment 3, explanation will be given on a picture display device, forming a picture display portion and a peripheral circuit portion in one body on a single insulative substrate, upon basis of FIGS. 9(a) and (b) and FIGS. 10(a) and (b). With paying attention to the characteristics required to the peripheral circuit portion and the picture display portion, the manufacturing processes or steps of the thin-film semiconductor integrated circuit device are used properly, thereby achieving the desired characteristics thereof.

First of all, explanation will be given on the characteristics required to the above-mentioned picture display portion, and the peripheral circuit portion, such as a source driver, etc., briefly. For the TFTs constructing the picture display portion, it is most important that the drain current is made small when they are in Off condition, and that there is no fluctuation or unevenness between the pixels thereof, however a speed is not required to be so quick. Namely, in general, it is desirable to employ the amorphous crystalline Si, which has a speed relatively slow, but the difference or unevenness in the mobility is not so high over a region of entire pixels. However, with the TFT constructing the peripheral circuit portion for driving this picture display portion, it is required to have a very high carrier mobility for processing information signals much more, therefore it is required to escape from scattering potential on the crystal grain boundary surface, through single crystallization of the TFT active region.

Such the picture display device is manufactured by forming the TFTs constructing the picture display portion on the amorphous crystalline thin-film, while the TFTs constructing the peripheral circuit portion required to have a high speed operation on the single crystallized regions, which are formed to be divided and disposed in the matrix-like manner, in the embodiment 1 or 2 mentioned above.

Figure 9A:
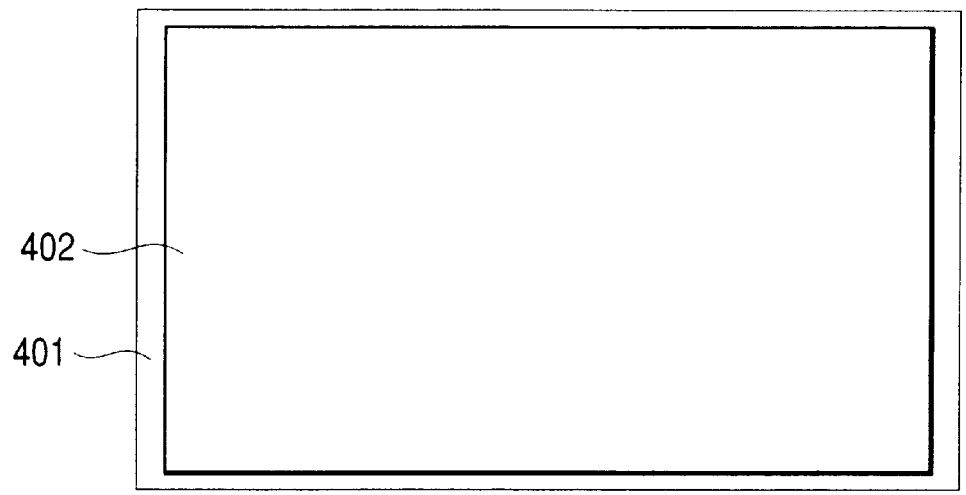
FIGS. 9(*a*) and (*b*) are plan views for showing a picture display device and a manufacturing method thereof, in connection with a third embodiment of the present invention.

As shown by the plan view in the FIG. 9(a), on a piece of common insulative substrate (for example, a glass substrate) 401, having sizes necessary for the picture display device, is accumulated to form an amorphous crystalline semiconductor thin-film 402 of group IV through the decompression CVD method, etc. In the present embodiment, the amorphous crystalline Si thin-film is accumulated to have a thickness of around 80 nm.

Figure 9B:
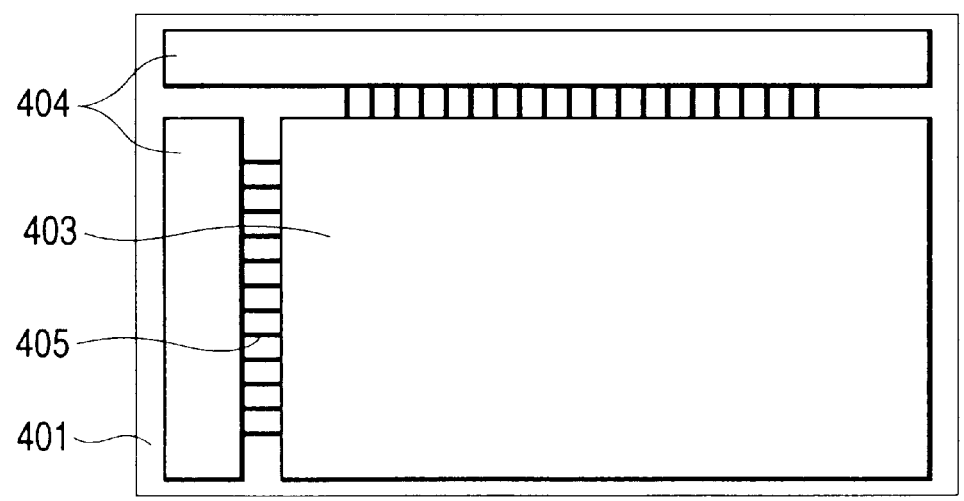

After that, as shown in the FIG. 9(b), in order to divide into a region 403, where the picture display portion is formed over a large area thereof, and a region 404, where the peripheral circuit portion is constructed with in an area smaller than that, the above-mentioned amorphous crystalline semiconductor thin-film is separated by using the etching method. The separation of this amorphous crystalline semiconductor layer is necessary, so that the crystal growth in the region 404 due to heating process thereafter does not bring about an influence upon the amorphous crystalline semiconductor region 403 and/or other region(s). Further, as shown in the figure, depending upon the circuit construction of the picture display device as a whole, it is also necessary to separate or divide the amorphous crystalline semiconductor layer for use of the peripheral circuit portion into plural number, so as to be rectangular surfaces, respectively.

Next, plural number of single crystal regions are formed in the region 404 for forming the peripheral circuit portion, being divided and disposed in the matrix-like manner in the vertical and horizontal directions, by using the method for forming the single crystal thin-film, which is explained in the above-mentioned embodiment 1 or 2, in particular in the FIGS. 1(a) to (d) or the FIGS. 8(a) to (f). In this instance, since no crystallization accelerating material is adhered (or added) thereupon, it takes an enormous time (to several ten days) for crystallizing the amorphous crystalline Si thin-film of the picture display region 403 under the heating process of a low temperature, for example, at 450° C. and more or less, therefore depending upon the process of crystallization of this peripheral circuit portion, the picture display region may remain as it is under the amorphous crystalline condition, without change in the crystallization thereof.

After finishing the crystallization of this picture display portion, the step enters into a process of forming TFTs, as was explained in the above-mentioned embodiment 1 or 2. In this instance, as was described in the above, since a main surface of the each single crystal region forms a one surface height level, being almost common with the main surfaces of the semiconductor regions 403 and 404 from a view point of the insulator substrate 401, not only the TFT for use in the peripheral circuit portion, but also the TFTs for use in the picture display device can be built in through the same manufacturing processes, collectively. However, the way of making up the TFTs for use in the picture display portion is already well-known, therefore the detailed explanation thereon is omitted in the present specification, however they can be formed in the same manner as in the processes explained in the FIGS. 7(a) to (f).

After that, inner-wiring is treated inside each of the peripheral circuit region 404 and the picture display region 403, as well as cross-wiring between those both regions, by using metal thin-film wiring of, such as Al, etc., thereby completing the display device, as shown in the FIG. 9(b).

Figure 10A:
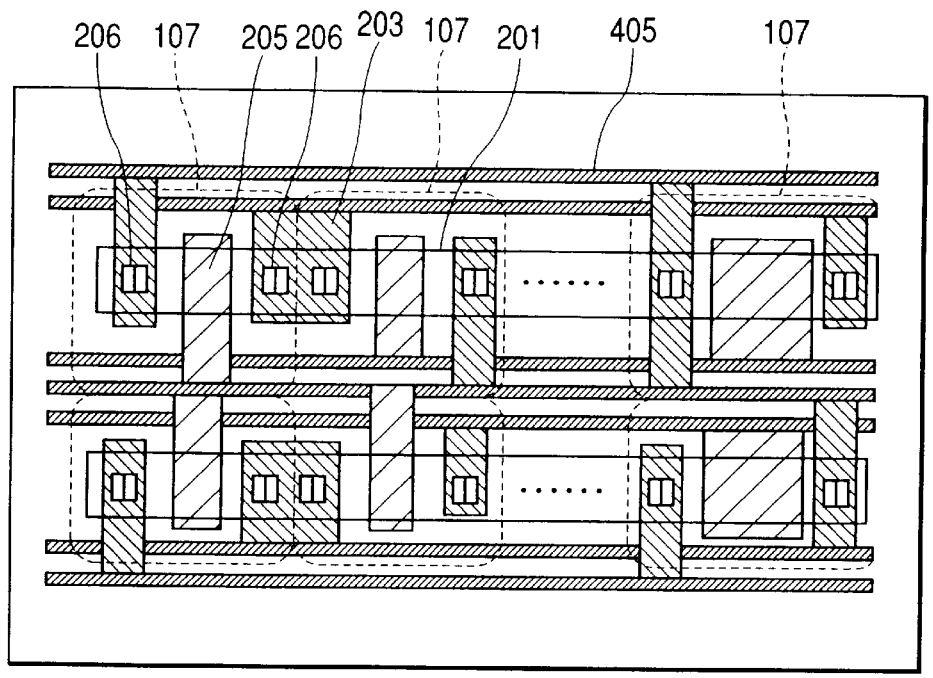
FIGS. 10(*a*) and (*b*) are plan views of an essential portion, for explaining the thin-film semiconductor integrated circuit device, which is installed within the picture display device, in connection with the third embodiment of the present invention.
Figure 10B:
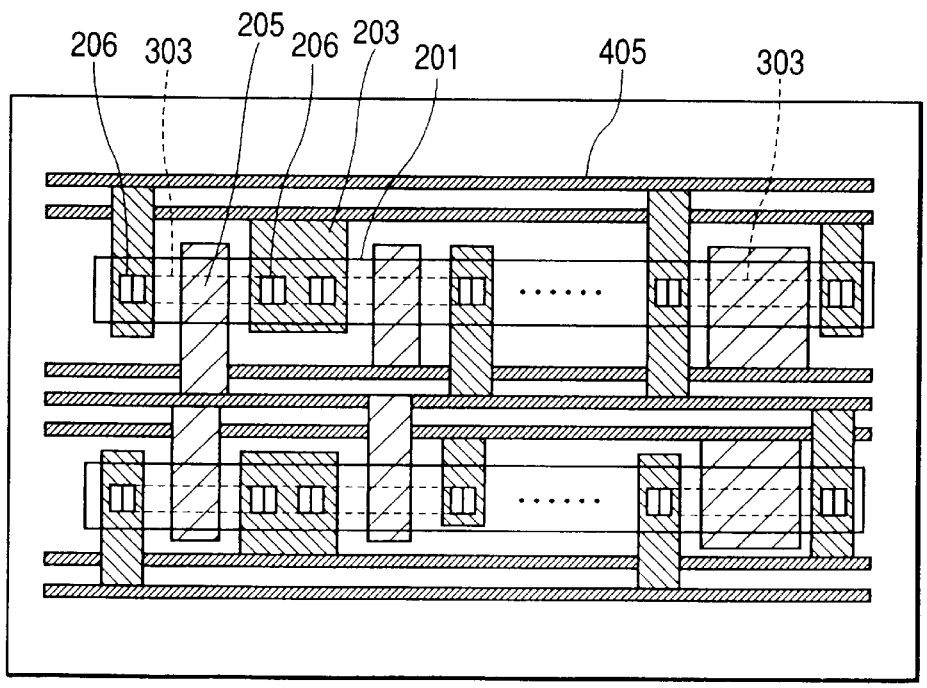

In FIG. 10(a) or (b) is shown an example of an enlarged plan view of an essential portion, in particular, of the thin-film semiconductor integrated circuit formed in the peripheral circuit portion 404. The FIG. 10(a) shows that in a case of applying the above-mentioned embodiment 1 therein, and the FIG. 10(b) that in a case of applying the above-mentioned embodiment 2 therein.

In the same figures, portions 107 and 303, which are enclosed by dotted lines, indicate the semiconductor single crystal portions (regions) divided and disposed in the matrix-like manner, 201 the active region of TFT, 203 the drain region, 205 the gate electrode, 206 a contact provided in the source or drain region, and 405 the metal wiring of Al, etc.

By means of the TFT forming processes which are appropriately used depending upon the purposes of the uses thereof, it is possible to manufacture the thin-film semiconductor integrated circuit devices, being superior from view points of the performances and the costs thereof.

For example, though the display device is manufactured while maintaining the condition of the amorphous crystalline semiconductor of the picture display portion 403 as it is in the above-mentioned embodiment 3, however not be restricted to this, it is also possible to apply the thin-film semiconductor integrated circuit device and the manufacturing method thereof, which are mentioned in the embodiment 1 or 2, to this picture display portion 403. Namely, inherently in the picture display portion 403, since a large number of the TFTs, i.e., electronic circuit parts for constructing it, are disposed precisely and regularly, in a manner of a very fine matrix, corresponding to a predetermined distance between pixels, therefore, with using such the feature, the above-mentioned picture display portion 403 is constructed by the thin-film semiconductor integrated circuit device, which has the single crystal portions, being divided and disposed regularly in the matrix-like manner, in the embodiment 1 or 2, and wherein the TFTs are provided in those single crystal portions by bringing the surfaces thereof into the active regions. The manufacturing method thereof is omitted herein, since it is similar to that of the embodiment 3, however in this display device is greatly improved in display characteristics thereof, comparing the case of the amorphous crystalline semiconductor layer. Also, since the each TFT of the picture display portion 403 can be uniformed in the electric characteristics thereof, it is possible to realize a display device having a large screen, as well as uniform characteristics therewith.

Also in the same manner, by constructing both the picture display portion 403 and the peripheral circuit portion 404 with the thin-film semiconductor integrated circuit devices, each having the single crystal portions divided and disposed in the matrix-like manner as was explained in the embodiment 1 or 2, and wherein the TFTs are provided in those single crystal portions by bringing the surfaces thereof into the active regions, it is possible to manufacture the display device having superior characteristics therewith, upon one piece of common glass substrate through the same manufacturing processes.

In the above, the present invention was explained on the basis of various embodiments thereof, however the following matters are also included into a breadth of the present invention.

(1) A thin-film semiconductor integrated circuit device, comprising: an insulative substrate; and a semiconductor thin-film, formed on the insulative substrate, from a single crystal grain of an element of group IV (any one of Si, Ge, C, Sn, and Pb) having a size from 0.1 μm to 20 μm in diameter thereof, or mixed crystals thereof, wherein a transistor active region is formed on one of the crystal grain.

(2) A manufacturing method of the thin-film semiconductor integrated circuit device, comprising the following steps: a step for forming the amorphous crystalline thin-film of the group IV mentioned above, on the insulative substrate; a step for forming a region of the single crystal grain of any one of elements, Si, Ge, C, Sn, Pb, Ni, Co, Cu, Pd, Pt, Ag, Au, In, Sn, Al or Sb, being different from said the thin-film of the group IV, or of the mixed crystal thereof, on a boundary surface between said insulative substrate and said amorphous crystalline thin-film of the group IV, or on said amorphous crystalline thin-film of the group Iv, or inside said amorphous crystalline thin-film of the group Iv, or at plural positions of each thereof; and a step for crystallizing said amorphous crystalline thin-film of the group Iv.

(3) A manufacturing method of the thin-film semiconductor integrated circuit device, comprising the following steps: a step for forming at least one of the amorphous crystalline thin-film of the group IV mentioned above, in a form of rectangular having length from 100 nm to 20 μm, width from 100 nm to 20 μm, and thickness from 10 nm to 1 μm, on the insulative substrate; a step for partially crystallizing said rectangular thin-film region by adhering a crystallization accelerating agent made of any one of elements, Si, Ge, C, Sn, Pb, Ni, Co, Cu, Pd, Pt, Ag, Au, In, Sn, Al or Sb, being different from said the thin-film of the group IV, or of the mixed crystal thereof, onto a portion of said rectangular region, and by treating with heating process thereon; and a step for forming transistors having active regions thereof on a surface and in an inside of said rectangular region.

As is fully explained in the above, according to the present invention, in the Si thin-film, as a material of elements of the thin-film semiconductor integrated circuit device, since the single crystal regions to form the TFT active regions therewith, which are divided and disposed in the matrix-like manner, can be formed at a low temperature, and the carrier diffusion due to the crystal grain boundary can be suppressed, thereby realizing a high mobility therein. Accordingly, with applying it into the TFTs constructing the picture display portion and/or the peripheral circuit portion of the picture display device, which are formed in one body on a single glass substrate, it is possible to made up the picture display device having high performances and a large screen area, being equal to or larger than 15 inches, for example.

What is claimed is:

1. A thin-film semiconductor integrated circuit, comprising:
   a insulator substrate;
   a plural number of semiconductor single crystal portions accumulated on said insulator substrate, being divided and disposed in a matrix-like manner; and
   a plurality of thin-film semiconductor circuit elements, each being respectively provided on a surface of a corresponding one of said semiconductor single crystal portions to be completely inside of a crystal grain boundary of the corresponding semiconductor single crystal portion and each having said surface of said semiconductor single crystal portion as an active region thereof, wherein said active regions of each of said thin-film semiconductor circuit elements are spaced apart from a center of said corresponding semiconductor single crystal portion, eccentrically.

2. A thin-film semiconductor integrated circuit, as defined in claim 1, wherein the each surface of said plural number of semiconductor single crystal portions shows a (110) plane, and said semiconductor single crystal portions are bonded to one another by a crystal boundary therebetween.

3. A thin-film semiconductor integrated circuit, as defined in claim 1, wherein said plural number of semiconductor single crystal portions are made of Si containing Ge therein, and said active region of said thin-film semiconductor circuit element is provided in a region, which includes a center of said semiconductor single crystal portion.

4. A thin-film semiconductor integrated circuit, as defined in claim 1, wherein said plural number of semiconductor single crystal portions are each made of Si containing crystallization acceleration metal therein located at the center of said semiconductor single crystal portion, and said active region of said thin-film semiconductor circuit element is provided in the region outside of a center of said semiconductor single crystal portion, eccentrically, to be spaced apart from said crystallization acceleration metal.

5. A thin film semiconductor integrated circuit, as is defined in claim 4, wherein, in each of said plurality of semiconductor single crystal portions, said active region is spaced apart by a distance of at least 150 nm from the center of the semiconductor single crystal portion at which center the crystallization acceleration metal is formed.

6. A thin film semiconductor integrated circuit, as is defined in claim 5, wherein, in each of said plural number of semiconductor single crystal portions, the entire active region of the thin-film semiconductor circuit element is spaced apart from the center of said semiconductor single crystal portion.

7. A thin film semiconductor integrated circuit, as is defined in claim 4, wherein,
   in each of said plural number of semiconductor single crystal portions, the entire active region of the thin-film semiconductor circuit element is spaced apart from the center of said semiconductor single crystal portion.

8. A thin film semiconductor integrated circuit, as is defined in claim 1, wherein, in each of said plural number of semiconductor single crystal portions, the entire active region of the thin-film semiconductor circuit element is spaced apart from the center of said semiconductor single crystal portion.

* * * * *